United States Patent
Alex (10) Patent No.: US 9,520,849 B2
(45) Date of Patent: Dec. 13, 2016

(54) RAIL-TO-RAIL CONSTANT TRANSCONDUCTANCE DIFFERENTIAL INPUT STAGE

(71) Applicant: TEXAS INSTRUMENTS INCORPORATED, Dallas, TX (US)

(72) Inventor: Saju Mathew Alex, Austin, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 748 days.

(21) Appl. No.: 13/933,647

(22) Filed: Jul. 2, 2013

(65) Prior Publication Data

US 2014/0139017 A1    May 22, 2014

Related U.S. Application Data

(60) Provisional application No. 61/727,531, filed on Nov. 16, 2012.

(51) Int. Cl.
*H03F 3/45*    (2006.01)

(52) U.S. Cl.
CPC .......... *H03F 3/45183* (2013.01); *Y10T 307/25* (2015.04)

(58) Field of Classification Search
CPC ....................................................... H03F 3/45
USPC ........................................ 330/253, 258, 261
See application file for complete search history.

(56) References Cited

U.S. PATENT DOCUMENTS

| | | | | |
|---|---|---|---|---|
| 4,904,952 A | * | 2/1990 | Tanimoto | H03F 3/45103 330/252 |
| 5,883,910 A | * | 3/1999 | Link | H01S 5/042 372/34 |
| 6,188,280 B1 | * | 2/2001 | Filip | H03F 1/3211 330/252 |
| 6,429,720 B1 | * | 8/2002 | Gilbert | G01R 19/02 327/348 |
| 6,784,698 B1 | * | 8/2004 | Brenden | H03F 3/3062 327/51 |
| 7,187,236 B2 | | 3/2007 | Britton, Jr. | |

(Continued)

FOREIGN PATENT DOCUMENTS

WO    WO 2004107566    12/2004

*Primary Examiner* — Patricia T Nguyen
(74) *Attorney, Agent, or Firm* — Gregory J. Albin; Charles A. Brill; Frank D. Cimino (57) ABSTRACT

A primary differential input pair of transistors and a secondary differential input pair of transistors are capable of operating in parallel to provide load current. A level-shifting pre-stage to the secondary differential pair downwardly level-shifts rail-to-rail input signals. Doing so prevents the secondary differential pair from entering cut-off. A tail current shunt device provides tail current to the secondary differential pair as the primary differential pair approaches cut-off when a common-mode component of the input signals approaches the positive voltage rail. Consequently, the sum of currents through first differential input transistors associated with the primary and secondary differential input pairs remains constant to the first load. Likewise, the sum of currents through the second differential input transistors associated with the primary and secondary differential input pairs remains constant to the second load. Both arms of the composite differential input stage present constant transconductances to their respective loads as a result.

15 Claims, 4 Drawing Sheets

(56) References Cited

U.S. PATENT DOCUMENTS

| | | | |
|---|---|---|---|
| 2005/0195032 A1* | 9/2005 | Wang | H03F 3/45183 |
| | | | 330/253 |
| 2006/0049873 A1 | 3/2006 | Britton, Jr. et al. | |
| 2006/0119429 A1* | 6/2006 | Lim | H03F 3/189 |
| | | | 330/253 |
| 2011/0298541 A1 | 12/2011 | Shi | |

* cited by examiner

FIG. 3

FIG. 4B

RAIL-TO-RAIL CONSTANT TRANSCONDUCTANCE DIFFERENTIAL INPUT STAGE

PRIORITY CLAIM

This application claims the benefit of priority under 35 U.S.C. §119(e) to U.S. Provisional Patent Application Ser. No. 61/727,531 titled "RAIL TO RAIL DIFFERENTIAL INPUT STAGE" filed on Nov. 16, 2012 and incorporated herein by reference in its entirety.

TECHNICAL FIELD

Structures and methods described herein relate to electronic circuits, including differential input stages and electronic comparators.

BACKGROUND INFORMATION

Figures 1, 2:
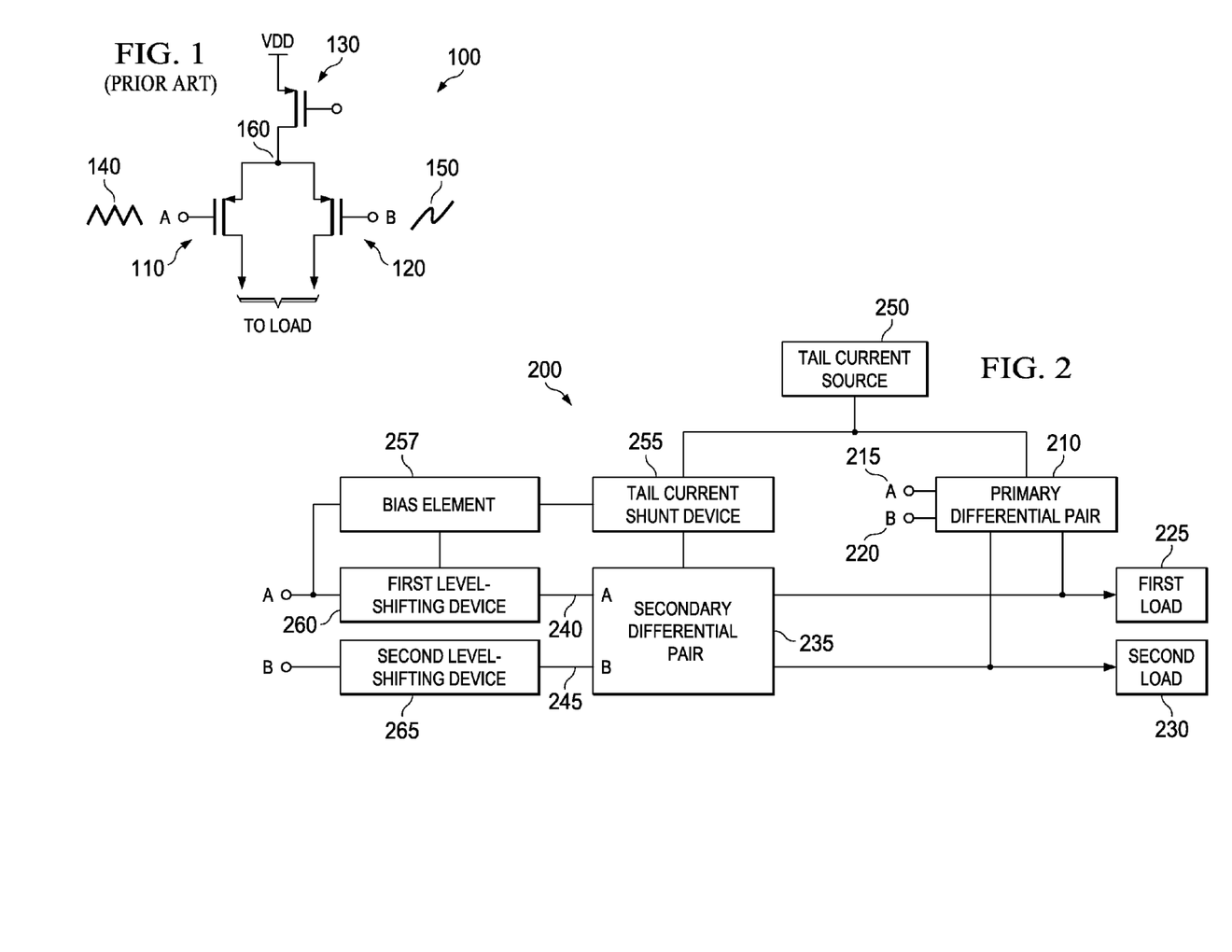
FIG. 1 is a schematic diagram of a traditional differential input apparatus according to the prior art.
FIG. 2 is a block diagram of a constant transconductance electronic differential input apparatus according to various example embodiments of the invention.

FIG. 1 is a schematic diagram of a traditional differential input stage 100 according to the prior art. The differential input stage 100 includes first and second differential input transistors 110 and 120, respectively. The differential input stage 100 also includes a tail current source 130. Some applications, such as comparators, focus on the use of such stage with common-mode input voltages.

In some cases, the input voltages may be allowed to vary from rail-to-rail. For example, the input waveforms 140 and 150 may both simultaneously approach the positive voltage rail. In the latter case, both of the differential input transistors 110 and 120 approach a cut-off condition and the tail circuit node 160 goes positive. As the V(DS) of the tail current source 130 decreases, the tail current source 130 begins to operate in the linear region and ceases to provide a constant source of tail current. Consequently, the traditional differential input stage 100 presents an inconsistent transconductance as a common-mode component of the input signals approaches the positive voltage rail.

SUMMARY OF THE INVENTION

Apparatus and methods described herein provide a primary differential input pair of transistors and a secondary differential input pair of transistors. The primary and secondary differential input pairs are capable of operating in parallel to provide load current. A level-shifting pre-stage to the secondary differential pair level-shifts input signals downward. Doing so prevents the secondary differential pair from entering cut-off during positive common-mode signal excursions. A tail current shunt device provides tail current to the secondary differential pair as the primary differential pair approaches cut-off when both input signals approach the positive voltage rail. Consequently, the sum of currents through first differential input transistors associated with the primary and secondary differential input pairs remains constant to the first load. Likewise, the sum of currents through the second differential input transistors associated with the primary and secondary differential input pairs remains constant to the second load. Both arms of the composite differential input stage present constant transconductances to their respective loads throughout a rail-to-rail range of a common-mode component of the input signals as a result.

Although example embodiments shown herein may be implemented with NMOS transistors for certain stages and PMOS transistors for other stages, it is understood that equivalent substitutions may be made such that some or all stages may be implemented with complementary logic. Additionally, functionality described herein may be achieved using bipolar transistors and/or switching and gating logic other than transistors such as vacuum tube devices and future equivalents. Embodiments herein include the property of transconductance being directly proportional to channel current.

DETAILED DESCRIPTION

FIG. 2 is a block diagram of a constant transconductance electronic differential input apparatus 200 according to various example embodiments of the invention. The differential input apparatus 200 includes a tail-connected primary differential pair 210. The primary differential pair 210 receives first and second input signals at inputs 215 and 220. The primary differential pair 210 passes load current to first and second loads 225 and 230 responsive to the first and second input signals, respectively.

The differential input apparatus 200 also includes a tail-connected secondary differential pair 235. The secondary differential pair 235 receives downward level-shifted versions of the first and second input signals at inputs 240 and 245, respectively. The primary differential pair 210, the secondary differential pair 235, or both conduct current as the first and second input signals approach a positive voltage rail simultaneously. Parallel conduction paths via the primary differential pair 210 and the secondary differential pair 235 operate to present a constant transconductance as a common-mode component of the first and second input signals approaches the positive voltage rail.

The differential input apparatus 200 also includes a tail current source 250 communicatively coupled to the primary and secondary differential pairs 210 and 235, respectively. Conduction by the primary and/or secondary differential pairs 210 and 235 operates to prevent linear region operation at the tail current source 250.

The differential input apparatus 200 further includes a tail current shunt device 255 in series between the tail current source 250 and the secondary differential pair 235. The tail current shunt device 255 supplies tail current to the secondary differential pair 235 as the first and second input signals approach a positive voltage rail and as the primary differential pair 210 approaches a cut-off condition. A bias element 257 coupled to the tail current shunt device 255 biases and enables the tail current shunt device 255 to conduct when a first level-shifting device 260 enters a conduction state.

The differential input apparatus 200 also includes first and second level-shifting devices 260 and 265, respectively. The first and second level-shifting devices 260 and 265 are coupled to first and second inputs 240 and 245, respectively, of the secondary differential pair 235. The first and second level-shifting devices 260 and 265 provide downward level-shifted versions of the first and second input signals to the secondary differential pair 235. In some embodiments, the first and second level-shifting devices 260 and 265 may be source follower stages.

Figure 3:
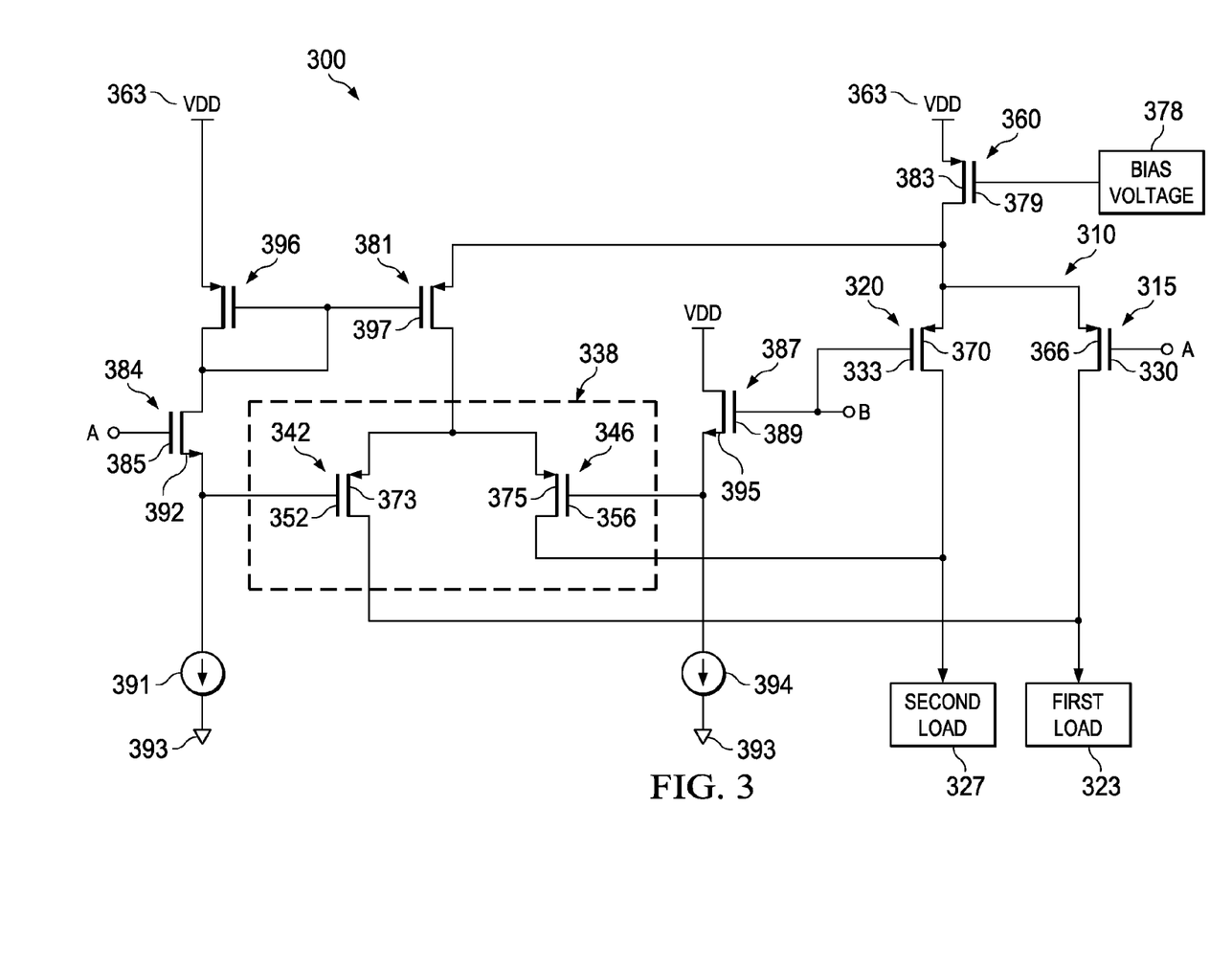
FIG. 3 is a schematic diagram of a constant transconductance electronic differential input apparatus according to various example embodiments.

FIG. 3 is a schematic diagram of a constant transconductance electronic differential input apparatus 300 according to various example embodiments. The differential input apparatus 300 includes a tail-connected primary differential pair of transistors 310. First and second transistors 315 and 320 of the primary differential pair 310 are current channel coupled in series with first and second loads 323 and 327, respectively. The first and second transistors 315 and 320 receive first and second input signals at first and second gates 330 and 333, respectively, of the primary differential pair of transistors 310. The first and second transistors 315 and 320 pass load current to the first and second loads 323 and 327, respectively, responsive to the first and second input signals.

The differential input apparatus 300 also includes a tail-connected secondary differential pair of transistors 338. First and second transistors 342 and 346 of the secondary differential pair 338 are current channel-coupled in series with the first and second loads 323 and 327, respectively. The first and second transistors 342 and 346 receive downward level-shifted versions of the first and second input signals at first and second gates 352 and 356, respectively, of the secondary differential pair of transistors 338. The secondary differential pair 338 conducts current responsive to the downward level-shifted versions of the differential input signals as the primary differential pair of transistors 310 approaches a cut-off condition. Thus, the apparatus 300 maintains a constant transconductance presented to each of the first and second loads 323 and 327 through all excursions of a common-mode component of the first and second input signals, even as the common-mode component approaches the positive voltage rail 363.

The differential input apparatus 300 further includes a tail current source transistor 360. The tail current source transistor 360 is communicatively coupled between the positive voltage rail 363 and current channels 366, 370, 373, and 375 associated with the primary and secondary differential pairs 310 and 338. The tail current source transistor 360 provides tail current to the primary and secondary differential pairs 310 and 338.

The differential input apparatus 300 also includes a bias voltage source 378 coupled to a gate 379 of the tail current source transistor 360. The bias voltage source 378 provides a bias voltage to the gate 379 of the tail current source transistor 360 and establishes a maximum tail current magnitude.

The differential input apparatus 300 further includes a tail current shunt transistor 381. The tail current shunt transistor 381 is channel-coupled in series between a tail current source transistor current channel 383 and the current channels 373 and 375 of the first and second transistors 342 and 346 of the secondary differential pair. The tail current shunt transistor 381 supplies tail current to the secondary differential pair 338 as the primary differential pair 310 approaches a cut-off condition.

The differential input apparatus 300 also includes a first source follower transistor 384. The first source follower transistor 384 is output-coupled to the gate 352 of the first transistor 342 of the secondary differential pair 338. The first source follower transistor 384 receives the first input signal at a gate 385 and generates the downward level-shifted version of the first input signal at the gate 352 of the first transistor 342 of the secondary differential pair 338.

The differential input apparatus 300 further includes a diode-connected transistor 396. The diode-connected transistor 396 is current channel-coupled in series between the positive voltage rail 363 and the first source follower transistor 384 and gate-coupled to a gate 397 of the tail current shunt transistor 381. The diode-connected transistor 396 enables the tail current shunt transistor 381 by pulling the gate 397 low when the first source follower transistor 384 enters a conduction state. Thus enabled, the tail current shunt transistor 381 is ready to supply tail current to the secondary differential pair 338 when the primary differential pair 310 approaches cut-off.

The differential input apparatus 300 also includes a second source follower transistor 387. The second source follower transistor 387 is output-coupled to the gate 356 of the second transistor 346 of the secondary differential pair 338. The second source follower transistor 387 receives the second input signal at a gate 389 and generates the downward level-shifted version of the second input signal at the gate 356 of the second transistor 346 of the secondary differential pair 338.

The differential input apparatus 300 further includes a first constant current source 391. The first constant current source 391 is coupled in series between a source terminal 392 of the first source follower transistor 384 and a ground or negative voltage rail 393. The first constant current source 391 provides a current load to the first source follower transistor 384.

The differential input apparatus 300 also includes a second constant current source 394. The second constant current source 394 is coupled in series between a source terminal 395 of the second source follower transistor 387 and the ground or negative voltage rail 393. The second constant current source 394 provides a current load to the second source follower transistor 387.

Figure 4A:
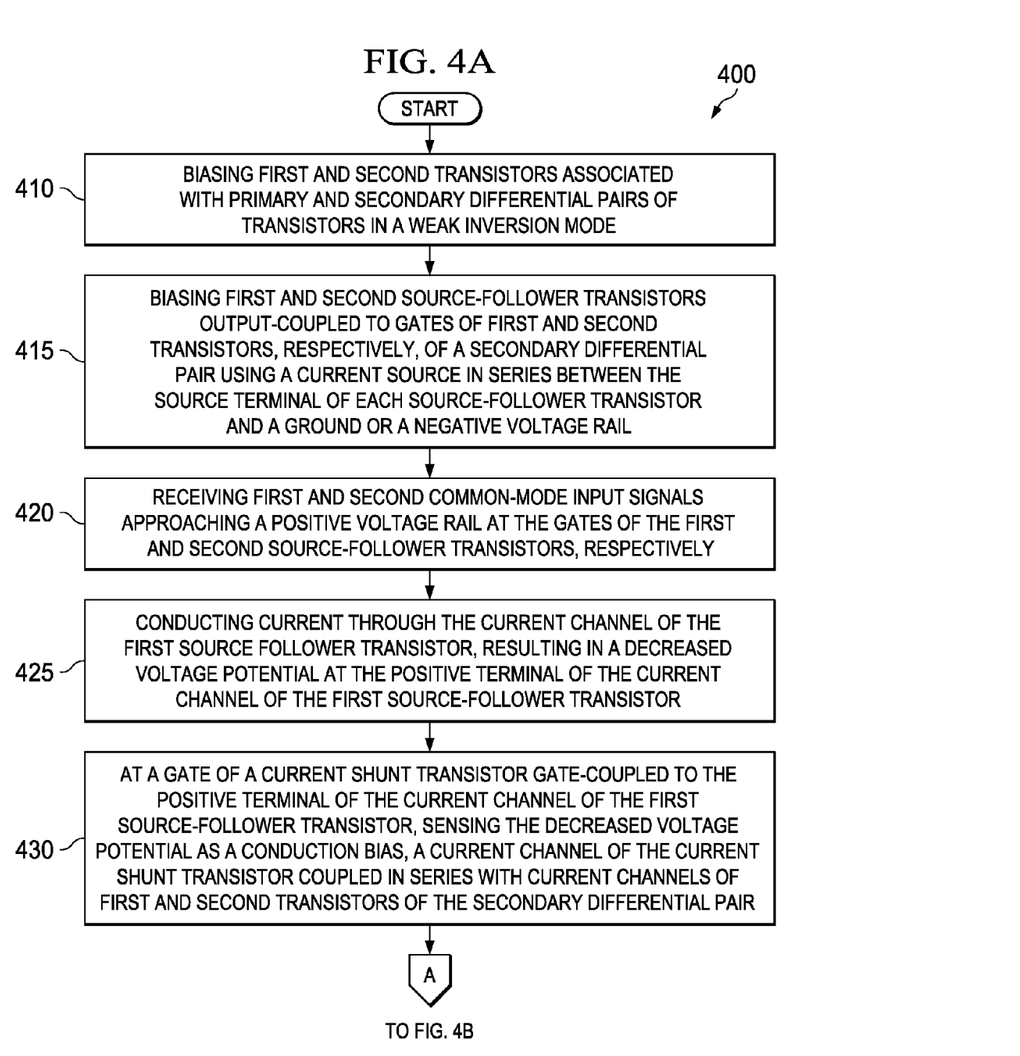
FIGS. 4A and 4B are a flow diagram of a method of providing a constant transconductance electronic differential input according to various example sequences.
Figure 4B:
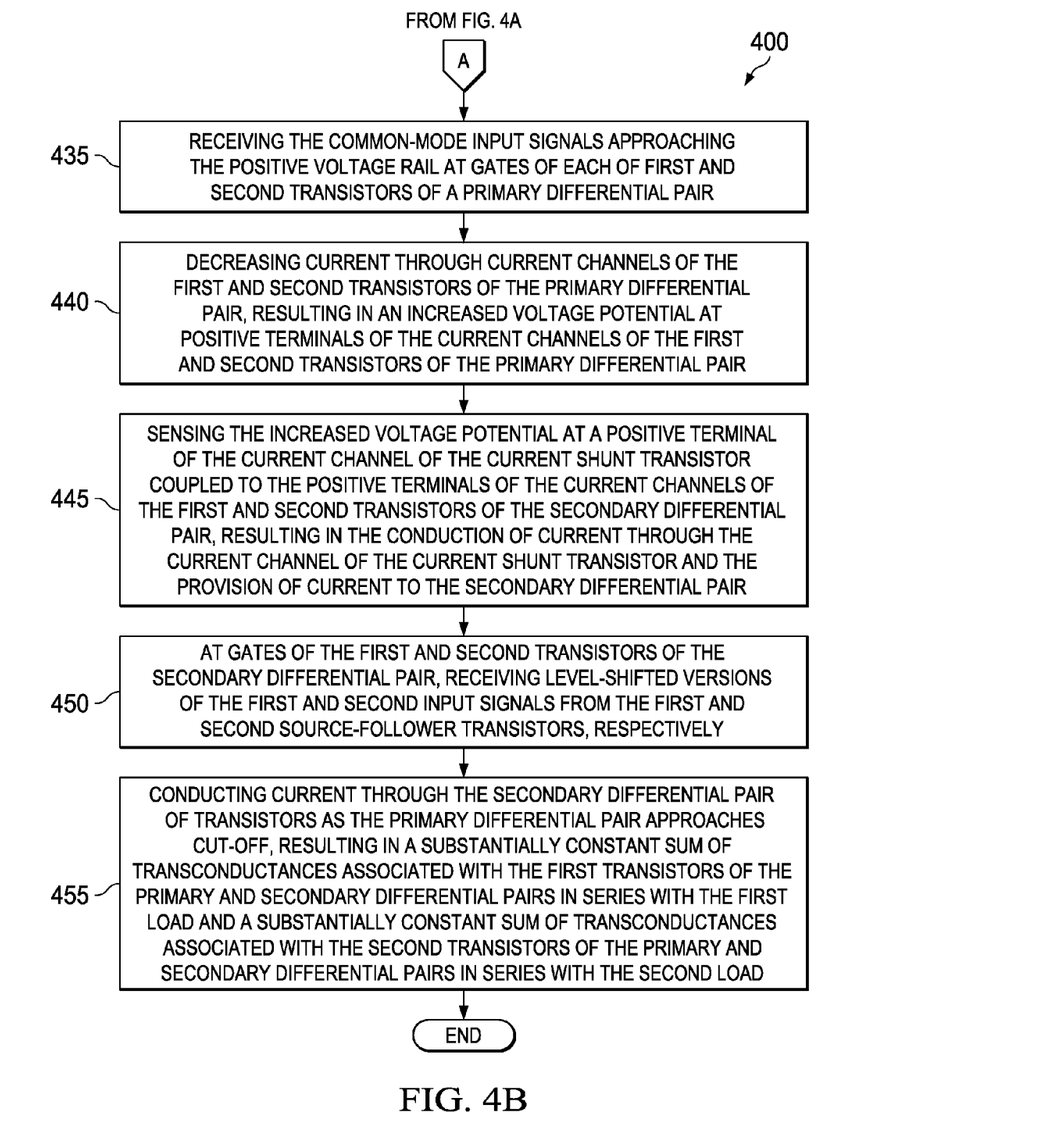

FIGS. 4A and 4B are a flow diagram of a method 400 of providing a constant transconductance electronic differential input according to various example sequences. The method 400 includes providing a constant current to a first load from a first transistor of a primary differential pair of transistors, a first transistor of a secondary differential pair of transistors, or both. The method 400 also includes providing a constant current to a second load from a second transistor of a primary differential pair of transistors, a second transistor of a secondary differential pair of transistors, or both. Thus, the apparatus 300 presents a constant transconductance throughout a rail-to-rail range of a common-mode component of the input signals.

The method 400 may commence at block 410 with biasing first and second transistors associated with primary and secondary differential pairs of transistors in a weak inversion mode.

The method 400 may proceed with biasing first and second source-follower transistors output-coupled to the gates of first and second transistors, respectively, of the secondary differential pair using a constant-current source in series between the source terminal of each source-follower transistor and a ground or a negative voltage rail, at block 415.

The method 400 may also include receiving first and second input signals with a common-mode component approaching a positive voltage rail at the gates of the first and second source-follower transistors, respectively, at block 420.

The method 400 may further include conducting current through the current channel of the first source-follower transistor, resulting in a decreased voltage potential at the positive terminal of the current channel of the first source-follower transistor, at block 425. The method 400 may also include sensing the decreased voltage potential at a gate of a current shunt transistor gate-coupled to the positive terminal of the current channel of the first source-follower transistor, at block 430. A current channel of the current shunt transistor is coupled in series with current channels of first and second transistors of the secondary differential pair. The decreased potential sensed at the gate of the current shunt transistor provides the current shunt transistor with a conduction bias.

The method 400 continues at block 435 with receiving input signals with a common-mode component approaching the positive voltage rail at gates of each of first and second transistors of a primary differential pair. The method 400 also includes decreasing current flow from a tail current source transistor through current channels of the first and second transistors of the primary differential pair and on to first and second loads, respectively, at block 440. The decreased current flow results in an increased voltage potential at a tail node associated with the primary differential pair.

The method 400 further includes sensing the increased voltage potential at a positive terminal of the current channel of the current shunt transistor coupled to the positive terminals of the current channels of the first and second transistors of the primary differential pair, at block 445. The increased voltage potential forward-biases the current channel of the previously gate-enabled tail current shunt transistor in order to provide current to first and second transistors associated with the secondary differential pair of transistors.

The method 400 also includes receiving downward level-shifted versions of the first and second input signals from the first and second source-follower transistors at gates of the first and second transistors, respectively, of the secondary differential pair, at block 450. The first transistors of the primary and secondary differential pairs share a first common load, while the second transistors of the primary and secondary differential pairs share a second common load.

The method 400 further includes conducting current through the secondary differential pair of transistors as the primary differential pair approaches cut-off, at block 455. Doing so results in a substantially constant sum of transconductances associated with the first transistors of the primary and secondary differential pairs in series with the first load and a substantially constant sum of transconductances associated with the second transistors of the primary and secondary differential pairs in series with the second load.

Apparatus and methods described herein may be useful in applications other than differential input comparators. Examples of the constant transconductance electronic differential input apparatus 200 and 300 and the method 400 of providing a constant-transconductance electronic differential input stage are intended to provide a general understanding of the structures of various embodiments and the sequences associated with various methods. They are not intended to serve as complete descriptions of all elements and features of apparatus, systems, and methods that might make use of these structures and sequences.

The various embodiments may be incorporated into semiconductor analog and digital circuits for use in receptacle power converters, electronic circuitry used in computers, communication and signal processing circuitry, single-processor or multi-processor modules, single or multiple embedded processors, multi-core processors, data switches, and application-specific modules including multi-layer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Apparatus and methods described herein provide a primary differential input pair of transistors and a secondary differential input pair of transistors capable of operating in parallel to provide load current. A level-shifting pre-stage to the secondary differential pair downward level-shifts rail-to-rail input signals to prevent the secondary differential pair from entering cut-off. A tail current shunt device provides tail current to the secondary differential pair as the primary differential pair approaches cut-off when both input signals approach the positive voltage rail simultaneously. Both arms of the composite differential input stage present constant transconductances to their respective loads as a result.

By way of illustration and not of limitation, the accompanying figures show specific aspects in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The aspects illustrated are described in sufficient detail to enable those skilled in the art to practice the teachings disclosed herein. Other aspects may be used and derived therefrom, such that structural and logical substitutions and changes may be made without departing from the scope of this disclosure. This Detailed Description, therefore, is not to be taken in a limiting sense. The breadth of various aspects is defined by the appended claims and the full range of equivalents to which such claims are entitled.

Such aspects of the inventive subject matter may be referred to herein individually or collectively by the term "invention" merely for convenience and without intending to voluntarily limit this application to any single invention or inventive concept, if more than one is in fact disclosed. Thus, although specific aspects have been illustrated and described herein, any arrangement calculated to achieve the same purpose may be substituted for the specific aspects shown. This disclosure is intended to cover any and all adaptations or variations of various aspects.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A differential input apparatus, comprising:
   a tail-connected primary differential pair to receive first and second input signals and to pass load current to first and second loads responsive to the first and second input signals, respectively;
   a tail-connected secondary differential pair to receive downward level-shifted versions of the first and second input signals, at least one of the primary or secondary differential pair to conduct current as a common-mode component of the first and second input signals approaches a positive voltage rail such as to present a constant transconductance in series with each of the first and second loads;
   a tail current source communicatively coupled to the primary and secondary differential pairs, conduction by the primary and secondary differential pairs to prevent linear region operation at the tail current source; and
   a tail current shunt device in series between the tail current source and the secondary differential pair, the tail current shunt device to supply tail current to the secondary differential pair as the first and second input signals approach a positive voltage rail and as the primary differential pair approaches a cut-off condition.

2. The differential input apparatus of claim 1, further comprising:
   first and second level-shifting devices coupled to inputs associated with the secondary differential pair to provide the downward level-shifted versions of the first and second input signals; and
   a bias element coupled to the tail current shunt device to bias and enable the tail current shunt device to conduct when the first level-shifting device enters a conduction state.

3. The differential input apparatus of claim 2, the first and second level-shifting devices being source follower stages.

4. A differential input apparatus, comprising:
   a tail-connected primary differential pair of transistors, first and second transistors of the primary differential pair current channel coupled in series with first and second loads, respectively, to receive first and second input signals at first and second gates, respectively, of the primary differential pair of transistors and to pass load current to the first and second loads responsive to the first and second input signals;
   a tail-connected secondary differential pair of transistors, first and second transistors of the secondary differential pair current channel-coupled in series with the first and second loads, respectively, to receive downward level-shifted versions of the first and second input signals at first and second gates, respectively, of the secondary differential pair of transistors, the secondary differential pair to conduct current responsive to the downward level-shifted versions of the differential input signals as the primary differential pair of transistors approaches a cut-off condition such as to present a constant transconductance to the first and second loads as a common-mode component of the first and second input signals approaches a positive voltage rail;
   a tail current source transistor communicatively coupled between a positive voltage rail and current channels associated with the primary and secondary differential pairs to provide tail current to the primary and secondary differential pairs; and
   a tail current shunt transistor channel-coupled in series between the tail current source transistor current channel and the current channels of the first and second transistors of the secondary differential pair, the tail current shunt transistor to supply tail current to the secondary differential pair as the primary differential pair approaches the cut-off condition.

5. The differential input apparatus of claim 4, further comprising:
   a bias voltage source coupled to the tail current source transistor to provide a bias voltage to a gate of the tail current source transistor and to establish a maximum tail current magnitude.

6. The differential input apparatus of claim 4, further comprising:
   a first source follower transistor output-coupled to a gate of the first transistor of the secondary differential pair to receive the first input signal at a gate of the first source follower transistor and to generate the downward level-shifted version of the first signal at the gate of the first transistor of the secondary differential pair; and
   a second source follower transistor output-coupled to a gate of the second transistor of the secondary differential pair to receive the second input signal at a gate of the second source follower transistor and to generate the downward level-shifted version of the second signal at the gate of the second transistor of the secondary differential pair.

7. The differential input apparatus of claim 6, further comprising:
   a first constant current source coupled in series between a source terminal of the first source follower transistor and at least one of a ground rail or a negative voltage rail to provide a current load to the first source follower transistor; and
   a second constant current source coupled in series between a source terminal of the second source follower transistor and at least one of the ground rail or the negative voltage rail to provide a current load to the second source follower transistor.

8. The differential input apparatus of claim 6, further comprising:
   a diode-connected transistor current channel-coupled in series between a positive voltage rail and the first source follower transistor and gate-coupled to a gate of the tail current shunt transistor to enable the tail current shunt transistor by pulling the gate of the tail current shunt transistor low when the first source follower transistor enters a conduction state.

9. A method of providing a constant-transconductance electronic differential input stage, comprising:
   receiving a first input signal approaching a positive voltage rail at a first gate associated with a first transistor of a tail-connected primary differential pair of transistors;
   receiving a second input signal approaching the positive voltage rail at a second gate associated with a second transistor of the tail-connected primary differential pair of transistors;
   decreasing current flow from a tail current source transistor through the primary differential pair, resulting in an increased voltage potential at a tail node associated with the primary differential pair;
   providing a tail current to first and second transistors associated with a secondary differential pair of transistors in order to maintain a constant first transconductance in series with a first load associated with the first transistors of the primary and secondary differential pairs and to maintain a constant second transconductance in series with a second load associated with the second transistors of the primary and secondary differential pairs as a common-mode component of the first and second input signals approaches the positive voltage rail;

receiving the first input signal approaching the positive voltage rail at a gate of a first source-follower transistor output-coupled to a gate of the first transistor of the secondary differential pair;

receiving the second input signal approaching the positive voltage rail at a gate of a second source-follower transistor output-coupled to a gate of the second transistor of the secondary differential pair; and conducting current through the first source-follower transistor, resulting in a decreased voltage at a positive terminal of a current channel associated with the first source-follower transistor and a bias toward conduction at a gate of a tail current shunt transistor gate-coupled to the positive terminal of the current channel associated with the first source-follower transistor and channel-coupled in series between a current channel of the tail current source transistor and current channels of the first and second transistors associated with the secondary differential pair.

10. The method of claim 9, further comprising:

biasing the first and second transistors associated with the primary and secondary differential pairs, respectively, in a weak inversion mode.

11. The method of claim 9, further comprising:

biasing the first source-follower transistor using a first constant-current source in series between a source terminal of the first source-follower transistor and at least one of a ground rail or a negative voltage rail; and biasing the second source-follower transistor using a second constant-current source in series between a source terminal of the second source-follower transistor and the ground rail or the negative voltage rail.

12. The method of claim 9, further comprising:

forward-biasing the current channel of the tail current shunt transistor using the increased voltage potential of the tail node associated with the primary differential pair, the tail node coupled to a positive terminal of the current channel of the tail current shunt transistor.

13. The method of claim 12, further comprising:

receiving a downward level-shifted version of the first input signal at a gate of the first transistor of the secondary differential pair of transistors, the first transistor of the secondary differential pair having a load in common with the first transistor of the primary differential pair of transistors; and receiving a downward level-shifted version of the second input signal at a gate of a second transistor of the secondary differential pair of transistors, the second transistor of the secondary differential pair having a load in common with the second transistor of the primary differential pair.

14. The method of claim 13, further comprising:

conducting a constant current through the first load from at least one of the first transistor of the primary differential pair or the first transistor of the secondary differential pair; and conducting a constant current through the second load from at least one of the second transistor of the primary differential pair or the second transistor of the secondary differential pair.

15. A differential input apparatus, comprising:

a tail-connected primary differential pair to receive first and second input signals and to pass load current to first and second loads responsive to the first and second input signals, respectively;

a tail-connected secondary differential pair to receive downward level-shifted versions of the first and second input signals; and a tail current shunt device in series between a tail current source and the secondary differential pair.

\* \* \* \* \*